US010588245B2

(12) United States Patent
Lucia et al.

(10) Patent No.: US 10,588,245 B2
(45) Date of Patent: *Mar. 10, 2020

(54) ASSEMBLY FOR EXTRACTING HEAT FROM A HOUSING FOR ELECTRONIC EQUIPMENT

(75) Inventors: David Lucia, Stafford Springs, CT (US); Michael Tresh, Haverhill, MA (US); Edward Bednarcik, East Greenwich, RI (US); Mark Germagian, Hubbardston, MA (US); John Prunier, Spencer, MA (US); Martin Olsen, East Greenwich, RI (US)

(73) Assignee: EATON INTELLIGENT POWER LIMITED, Dublin (IE)

(*) Notice: Subject to any disclaimer, the term of this patent is extended or adjusted under 35 U.S.C. 154(b) by 995 days.

This patent is subject to a terminal disclaimer.

(21) Appl. No.: 13/538,480

(22) Filed: Jun. 29, 2012
(Under 37 CFR 1.47)

(65) Prior Publication Data
US 2012/0329378 A1    Dec. 27, 2012

Related U.S. Application Data

(63) Continuation of application No. 12/409,647, filed on Mar. 24, 2009, now abandoned, which is a continuation-in-part of application No. 11/412,430, filed on Apr. 27, 2006, now Pat. No. 7,604,535.

(51) Int. Cl.
*H05K 7/00* (2006.01)
*H05K 7/20* (2006.01)

(52) U.S. Cl.
CPC ................. *H05K 7/20745* (2013.01)

(58) Field of Classification Search
CPC ....... H05K 7/20; H05K 7/20745; F25D 17/06
USPC ................................. 454/184, 187
See application file for complete search history.

(56) References Cited

U.S. PATENT DOCUMENTS

| 2,330,769 | A | * | 9/1943 | Wichner | 285/319 |
| 3,563,627 | A | * | 2/1971 | Whipps | 312/265.2 |
| 3,742,725 | A | * | 7/1973 | Berger | F24F 1/02 165/48.1 |
| 4,646,817 | A | * | 3/1987 | Van Ee | F24F 12/001 165/122 |
| 4,797,783 | A | * | 1/1989 | Kohmoto | H05K 7/20572 361/688 |
| 5,090,898 | A | * | 2/1992 | Smith | B31F 1/285 34/519 |

(Continued)

Primary Examiner — Helena Kosanovic
(74) Attorney, Agent, or Firm — Squire Patton Boggs US LLP

(57) ABSTRACT

An assembly for extracting heat from a housing for electronic equipment, the housing having an essentially solid top portion and an essentially solid back portion. The assembly includes a first opening in the top portion of the housing, the first opening located at the back of the top portion, proximate the back portion of the housing, a second opening in the back portion of the housing, the second opening located at the top of the back portion, proximate the top portion of the housing, wherein the first opening is contiguous with the second opening, and a chimney external to the housing and coupled to the housing. The chimney encompasses and is in fluid communication with the first and second openings.

17 Claims, 12 Drawing Sheets

(56) References Cited

U.S. PATENT DOCUMENTS

| | | | | |
|---|---|---|---|---|
| 5,377,503 A * | 1/1995 | Reedy | F24F 1/0014 | 165/137 |
| 5,419,138 A * | 5/1995 | Anderson | B01J 2/20 | 62/341 |
| 5,445,062 A * | 8/1995 | Polster | A47J 27/10 | 366/107 |
| 5,528,454 A * | 6/1996 | Niklos | 361/695 | |
| 5,536,079 A * | 7/1996 | Kostic | 312/265.3 | |
| 5,544,012 A * | 8/1996 | Koike | 361/695 | |
| 5,765,743 A * | 6/1998 | Sakiura et al. | 236/49.3 | |
| 5,987,908 A * | 11/1999 | Wetzel | F24F 1/027 | 62/259.1 |
| 6,034,873 A * | 3/2000 | Ståhl et al. | 361/701 | |
| 6,101,829 A * | 8/2000 | Robinson | F24F 1/0014 | 62/259.1 |
| 6,104,003 A * | 8/2000 | Jones | 219/400 | |
| 6,185,098 B1 * | 2/2001 | Benavides | 361/695 | |
| 6,365,830 B1 * | 4/2002 | Snider et al. | 174/484 | |
| 6,412,292 B2 * | 7/2002 | Spinazzola et al. | 62/89 | |
| 6,464,459 B2 * | 10/2002 | Illingworth | B64C 11/001 | 180/122 |
| 6,494,050 B2 * | 12/2002 | Spinazzola et al. | 62/89 | |
| 6,554,697 B1 * | 4/2003 | Koplin | 454/184 | |
| 6,592,448 B1 * | 7/2003 | Williams | 454/184 | |
| 6,603,660 B1 * | 8/2003 | Ehn et al. | 361/694 | |
| 6,788,535 B2 * | 9/2004 | Dodgen et al. | 361/695 | |
| 6,926,432 B2 * | 8/2005 | Rodriguez Barros | B60Q 1/2665 | 362/494 |
| 7,074,123 B2 * | 7/2006 | Bettridge et al. | 454/184 | |
| 7,154,748 B2 * | 12/2006 | Yamada | 361/690 | |
| 7,255,640 B2 * | 8/2007 | Aldag et al. | 454/184 | |
| 7,283,358 B2 * | 10/2007 | Campbell | F24F 13/04 | 361/694 |
| 7,430,117 B2 * | 9/2008 | Shabany | 361/695 | |
| 7,485,803 B2 * | 2/2009 | Adducci et al. | 174/50 | |
| 7,486,511 B1 * | 2/2009 | Griffel et al. | 361/679.46 | |
| 7,586,738 B1 * | 9/2009 | Hartzel | H02B 13/025 | 361/676 |
| 7,604,535 B2 * | 10/2009 | Germagian et al. | 454/184 | |
| 7,614,943 B2 * | 11/2009 | Lee | 454/184 | |
| 7,697,285 B2 * | 4/2010 | Donowho et al. | 361/690 | |
| 7,751,188 B1 * | 7/2010 | French et al. | 361/691 | |
| 7,798,684 B2 * | 9/2010 | Boissevain | 362/431 | |
| 7,804,685 B2 * | 9/2010 | Krietzman | 361/690 | |
| 7,828,465 B2 * | 11/2010 | Roberge | F21S 8/033 | 362/294 |
| 7,895,855 B2 * | 3/2011 | Gooch | 62/259.2 | |
| 7,898,799 B2 * | 3/2011 | Doll | 361/679.48 | |
| 7,903,403 B2 * | 3/2011 | Doll et al. | 361/679.5 | |
| 7,952,869 B2 * | 5/2011 | Lewis et al. | 361/695 | |
| 7,974,105 B2 * | 7/2011 | Dean et al. | 361/826 | |
| 8,056,352 B2 * | 11/2011 | Kang | F24F 1/0014 | 312/236 |
| D651,982 S * | 1/2012 | Karandikar et al. | D13/158 | |
| 8,107,238 B2 * | 1/2012 | Krietzman et al. | 361/690 | |
| 8,177,142 B2 * | 5/2012 | Ricciardi | A61L 2/22 | 239/102.2 |
| 8,196,604 B1 * | 6/2012 | Ricciardi | A61L 9/14 | 137/601.11 |
| 8,199,500 B2 * | 6/2012 | Yamagiwa | 361/692 | |
| 8,359,984 B1 * | 1/2013 | Wolf, II | A61L 9/14 | 108/147.19 |
| 8,508,940 B2 * | 8/2013 | Scheidler et al. | 361/695 | |
| 8,523,643 B1 * | 9/2013 | Roy | 454/184 | |
| 8,653,363 B2 * | 2/2014 | Behrens et al. | 174/50 | |
| 8,797,740 B2 * | 8/2014 | Campbell et al. | 361/701 | |
| 8,908,368 B2 * | 12/2014 | Campbell | 361/679.46 | |
| 9,016,352 B2 * | 4/2015 | Helbig et al. | 165/67 | |
| 2002/0059804 A1 * | 5/2002 | Spinazzola | G06F 1/20 | 62/259.2 |
| 2002/0064035 A1 * | 5/2002 | Mair et al. | 361/800 | |
| 2002/0108386 A1 * | 8/2002 | Spinazzola et al. | 62/259.2 | |
| 2002/0112495 A1 * | 8/2002 | Campbell | F24F 1/0003 | 62/259.1 |
| 2002/0141156 A1 * | 10/2002 | Edmunds et al. | 361/694 | |
| 2003/0094010 A1 * | 5/2003 | Katatani | F24F 1/027 | 62/259.1 |
| 2004/0094541 A1 * | 5/2004 | Lee | H05B 6/642 | 219/679 |
| 2004/0099747 A1 * | 5/2004 | Johnson et al. | 236/49.3 | |
| 2004/0100770 A1 * | 5/2004 | Chu et al. | 361/698 | |
| 2004/0132398 A1 * | 7/2004 | Sharp et al. | 454/184 | |
| 2004/0184233 A1 * | 9/2004 | Yamada | | |
| 2004/0190248 A1 * | 9/2004 | Patel et al. | 361/697 | |
| 2004/0198213 A1 * | 10/2004 | Knight | 454/184 | |
| 2004/0257766 A1 * | 12/2004 | Rasmussen et al. | 361/689 | |
| 2005/0168945 A1 * | 8/2005 | Coglitore | 361/695 | |
| 2005/0225936 A1 * | 10/2005 | Day | 361/687 | |
| 2005/0280986 A1 * | 12/2005 | Coglitore et al. | 361/687 | |
| 2006/0141921 A1 * | 6/2006 | Turek et al. | 454/184 | |
| 2007/0030650 A1 * | 2/2007 | Madara | H05K 7/20818 | 361/695 |
| 2007/0171613 A1 * | 7/2007 | McMahan et al. | 361/695 | |
| 2008/0151497 A1 * | 6/2008 | Lai | H05K 7/20736 | 361/695 |
| 2008/0259566 A1 * | 10/2008 | Fried | H05K 7/20809 | 361/699 |
| 2009/0059523 A1 * | 3/2009 | Mallia et al. | 361/695 | |
| 2009/0239460 A1 * | 9/2009 | Lucia et al. | 454/184 | |
| 2010/0216388 A1 * | 8/2010 | Tresh et al. | 454/184 | |
| 2011/0277967 A1 * | 11/2011 | Fried | F28D 15/0266 | 165/104.26 |

* cited by examiner

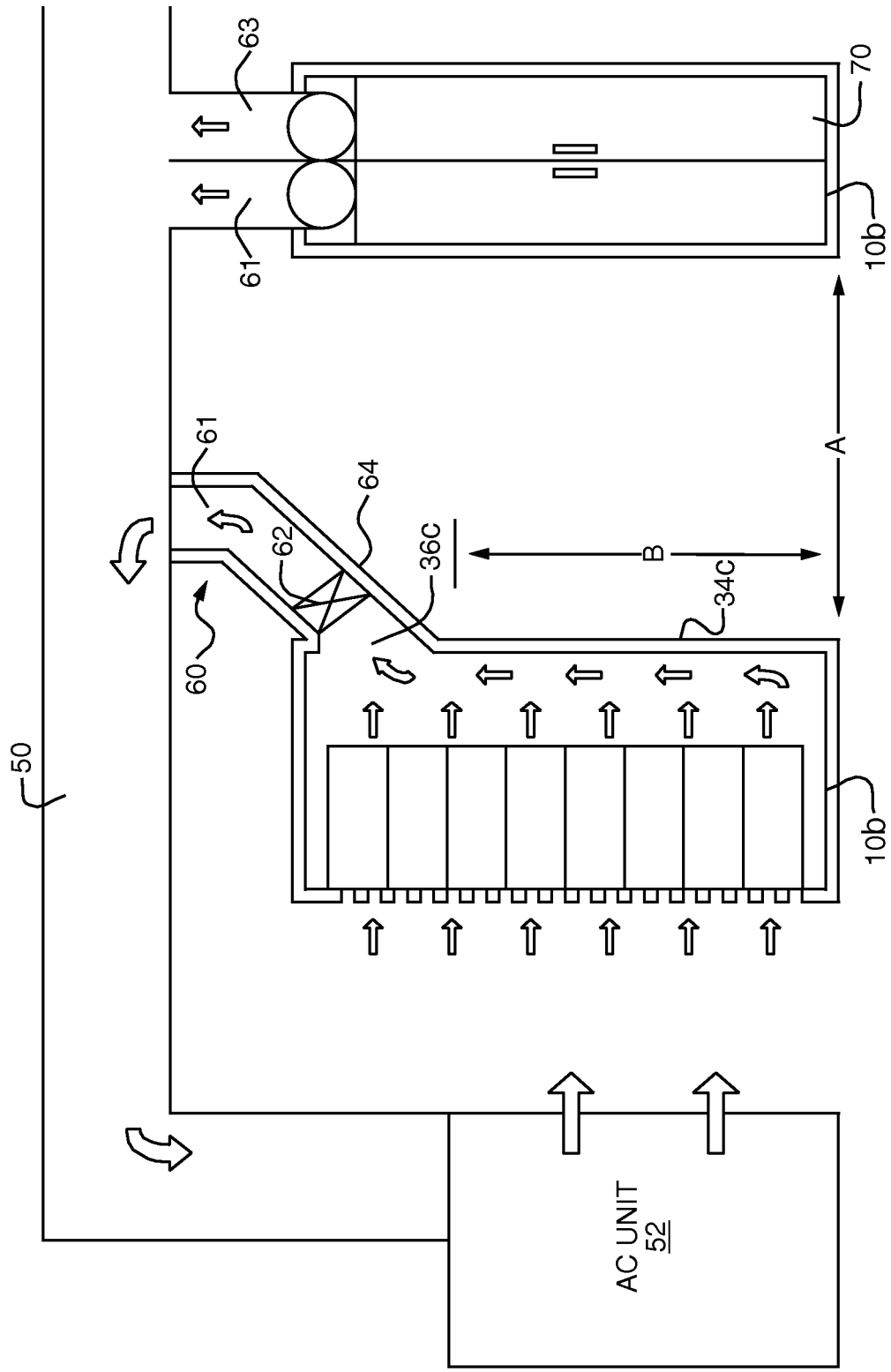

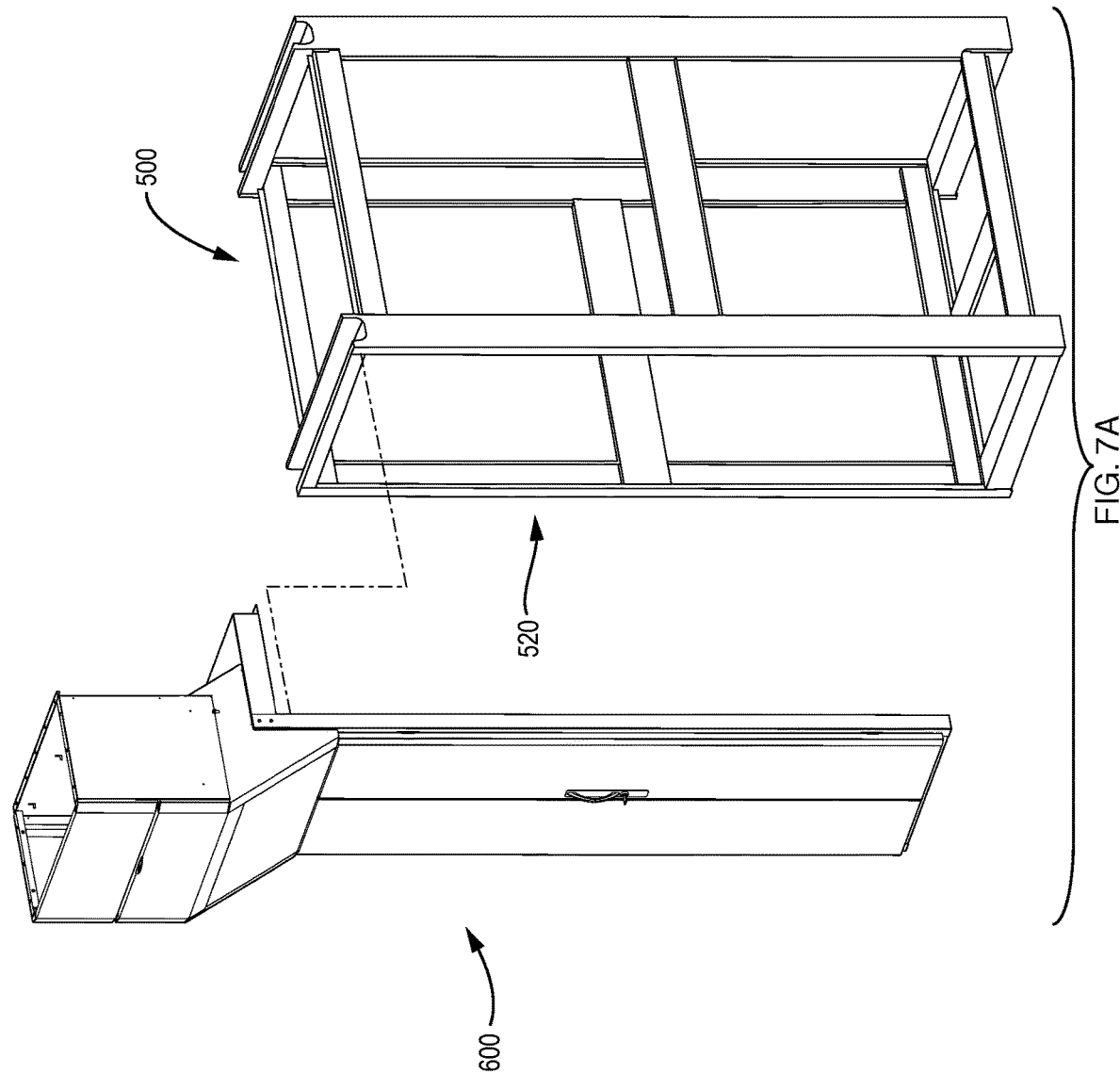

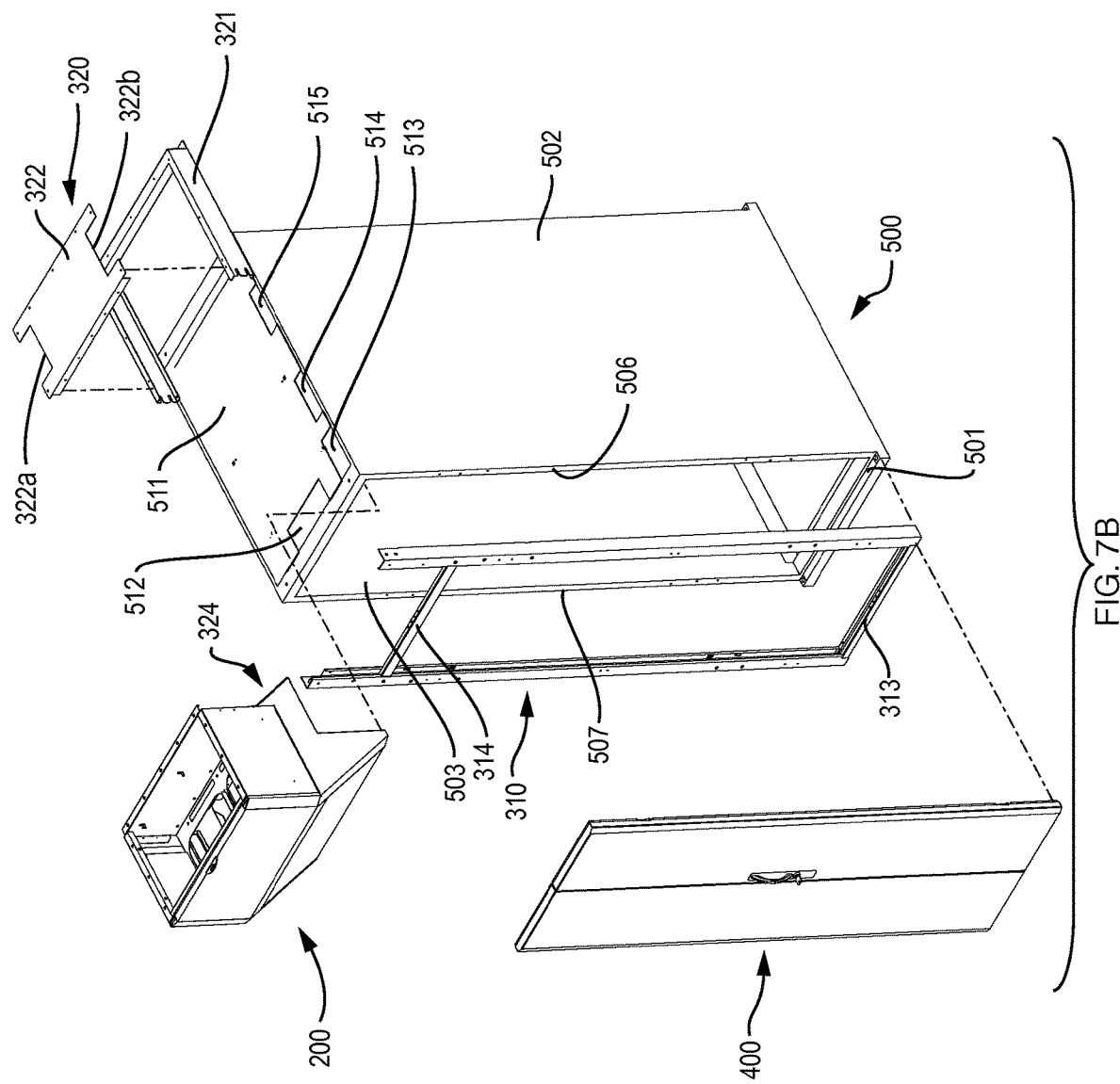

ASSEMBLY FOR EXTRACTING HEAT FROM A HOUSING FOR ELECTRONIC EQUIPMENT

CROSS REFERENCE TO RELATED APPLICATION

This patent application is a continuation of, and claims priority to, U.S. patent application Ser. No. 12/409,647 filed on Mar. 24, 2009, entitled "ASSEMBLY FOR EXTRACTING HEAT FROM A HOUSING FOR ELECTRONIC EQUIPMENT" which is a continuation-in-part of, and claims priority to, U.S. patent application Ser. No. 11/412,430, filed on Apr. 27, 2006, entitled "ASSEMBLY FOR EXTRACTING HEAT FROM A HOUSING FOR ELECTRONIC EQUIPMENT," the contents and teachings of each of which are hereby incorporated by reference in their entirety.

FIELD

This invention relates to a housing for electronic equipment with improved heat-dissipation characteristics.

BACKGROUND

Electronic equipment is often located within a housing, such as an equipment rack used to hold computer servers and the like in assemblies that are located within the rack. The electronic equipment generates substantial heat that must be dissipated. Cool air typically passes through the housings to help dissipate heat. In many cases, fans located in the front door and/or back door and/or within the rack and/or in the top of the rack are used to circulate the cold air and expel the warmed air.

One solution proposes a front or back rack panel that is several inches thick, and carries ducting and fans to route air through the rack. Cool air enters the bottom of the front, and exits the top of the back. However, such thickened panels increase the depth of the racks, which inherently limits the number of racks that can be fit into a data center.

SUMMARY

It is therefore an object of this invention to provide a rack cooling system that maintains the depth of the rack to a minimum, thus maximizing data center rack capacity.

This invention features an assembly for extracting heat from a housing for electronic equipment, the housing having a front, a back, two sides and a top, the assembly comprising a back for the housing that defines an open area proximate the top, and an air passageway in fluid communication with the open area in the back, to conduct heated air exiting the housing through the open area away from the housing. The open area preferably extends across at least the majority of the width of the back, and may extend across substantially all of the width of the back. The open area may also encompass a portion of the top adjacent to the back. The open area could alternatively be located in the top proximate the back. The front of the housing may be perforated. The housing may comprise an electronic equipment rack.

The assembly may further comprise an air-moving device in fluid communication with the air passageway. The air-moving device may be located in the air passageway, or located at the intersection of the back of the housing and the air passageway.

The air passageway may be directly coupled to the back of the housing. The air passageway may extend out from the back of the housing. The air passageway may further extend up after extending out from the back of the housing. In one particular embodiment, the air passageway may extend out at an angle of no more than about ninety degrees from the back of the housing; in a more particular embodiment, the air passageway may extend out at an angle of about forty-five degrees.

The air passageway may comprise a duct. The duct may be flexible or not. The assembly may comprise at least two ducts which are essentially parallel to one another. The assembly may further comprise an air-moving device in each duct. The air passageway may be located a sufficient height off the floor so as to meet relevant height safety regulations. There may be essentially no openings in the housing top, so that the entire top area is available for routing of additional equipment.

The invention also features a data center arrangement comprising at least two electronic equipment racks, each rack having a front, a back, two sides and a top, the arrangement comprising two electronic equipment racks spaced apart by about thirty-six inches, the back of each rack being essentially solid except for an open area proximate the top, and at least one air passageway in fluid communication with the open area in the back of each rack, to conduct heated air exiting the rack through the open area away from the rack. The data center may further comprise an enclosed ceiling. The air passageways may be in fluid communication with the enclosed ceiling. The data center may further comprise an air-cooling apparatus in fluid communication with the enclosed ceiling. The data center may further comprise means for providing cooled air from the air-cooling apparatus to the front of the racks.

The invention also features an assembly for extracting heat from a housing with an interior that is adapted to hold heat-generating electronic equipment, the housing comprising a top portion and a back portion, and defining a first opening in the top portion of the housing that leads to the housing interior, the first opening located at the back of the top portion, proximate the back portion of the housing, and structure defining a second opening in the back portion of the housing that leads to the housing interior, the second opening located at the top of the back portion, proximate the top portion of the housing. A chimney external to the housing is adapted to be coupled to the housing such that the chimney encompasses and is in fluid communication with the first and second openings, the chimney defining an inlet for taking in air leaving the housing through the first and second openings and an outlet for conducting the air out of the chimney.

The chimney may be coupled to the back portion of the housing below the second opening, and coupled to the top portion of the housing in front of the first opening. The back portion of the housing may be essentially vertical, and the chimney may extend out from the back portion of the housing. The chimney may extend up after extending out from the back portion of the housing. The chimney may extend out at an angle of less than ninety degrees from the back portion of the housing; the angle may be about forty-five degrees.

The first opening may extend across at least a majority of the width of the top portion of the housing, or across substantially all of the width of the top portion of the housing. The second opening may extend across at least a majority of the width of the back portion of the housing, or across substantially all of the width of the back portion of the housing. The assembly may further comprise at least one air-moving device in fluid communication with the chimney, which may be located in the chimney. The back portion of the housing may comprise one or more doors, to provide access to the housing through the back.

The housing may further comprise a support assembly that supports the housing's top and back portions, and the assembly for extracting heat may further comprise an intermediate assembly coupled to the support assembly, the intermediate assembly defining at least part of the back portion of the housing, wherein the chimney is coupled to the intermediate assembly. The intermediate assembly may comprise an intermediate assembly frame member defining two sides and the bottom of the back portion of the housing. The intermediate assembly may further comprise a door assembly hingedly coupled to the intermediate assembly frame member, to allow user access to the interior of the housing. The door assembly may comprise two doors, one hinged to each side of the intermediate assembly frame member. The doors and the intermediate assembly frame member may together define the back portion of the housing. The intermediate assembly may define the entire back portion and at least some of the top portion of the housing.

The chimney may comprise a first section that is coupled to the intermediate assembly, the first section extending out from the back portion of the housing at an angle of less than 90 degrees. The chimney may further comprise a second section that extends essentially vertically from the first section. The second section of the chimney may be an essentially rectangular duct. The assembly may further comprise one or more fan trays located within the chimney. The fan trays may be hot-swappable. The second section of the chimney may define an access door to allow access to the fan trays.

Also featured is an assembly for extracting heat from a housing with an interior that is adapted to hold heat-generating electronic equipment, the housing comprising an essentially solid top portion, an essentially solid back portion, and a support assembly that supports the housing's top and back portions, the assembly for extracting heat comprising a first opening extending across substantially all of the width of the top portion of the housing and leading to the housing interior, the first opening located at the back of the top portion, proximate the back portion of the housing, a second opening extending across substantially all of the width of the back portion of the housing and leading to the housing interior, the second opening located at the top of the back portion, proximate the top portion of the housing, an intermediate assembly coupled to the support assembly, the intermediate assembly defining at least part of the back portion of the housing and at least part of the top portion of the housing, and a chimney external to the housing and coupled to the intermediate assembly below the second opening and in front of the first opening such that the chimney encompasses and is in fluid communication with the first and second openings, the chimney defining an inlet for taking in air leaving the housing through the first and second openings and an outlet for conducting the air out of the chimney.

These and other aspects of the invention will become apparent from the following description. In the description, reference is made to the accompanying drawings, which form a part hereof, and in which there are shown preferred embodiments of the invention. Such embodiments do not necessarily represent the full scope of the invention, and reference is therefore made to the claims for understanding the true scope of the invention.

BRIEF DESCRIPTION OF THE DRAWINGS

Other objects, features and advantages will occur to those skilled in the art from the following description of the preferred embodiments and the accompanying drawings, in which:

FIG. 3 is a similar view showing two adjacent racks in a data center arrangement according to this invention;

FIG. 7A is an exploded view of the frame of an enclosure with an embodiment of the inventive assembly;

FIG. 7B is an exploded view of an enclosure with an embodiment of the inventive assembly;

DETAILED DESCRIPTION

This invention may be accomplished in an assembly for extracting heat from a housing for electronic equipment, the housing having a front, a back, two sides and a top, the assembly comprising a back for the housing that defines an open area proximate the top, and an air passageway in fluid communication with the open area in the back, to conduct heated air exiting the housing through the open area away from the housing. Typically, the front is perforated and the sides are solid, so that air flows into the housing through the front, through the electronic equipment located in the housing, and out of the housing through the open area, into the passageway.

Figure 1A:
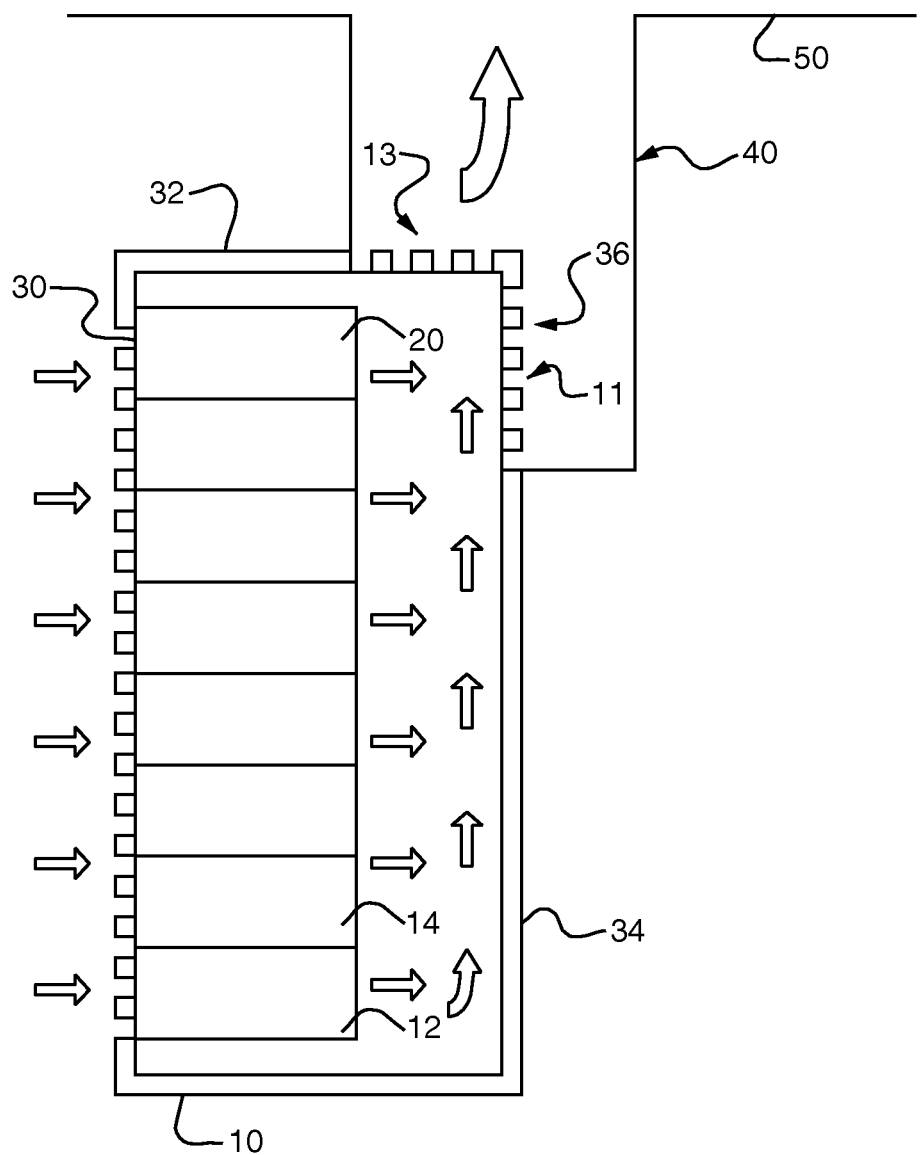
FIG. 1A is a schematic conceptual diagram of the assembly for extracting heat from a housing for electronic equipment of this invention.
Figure 1B:
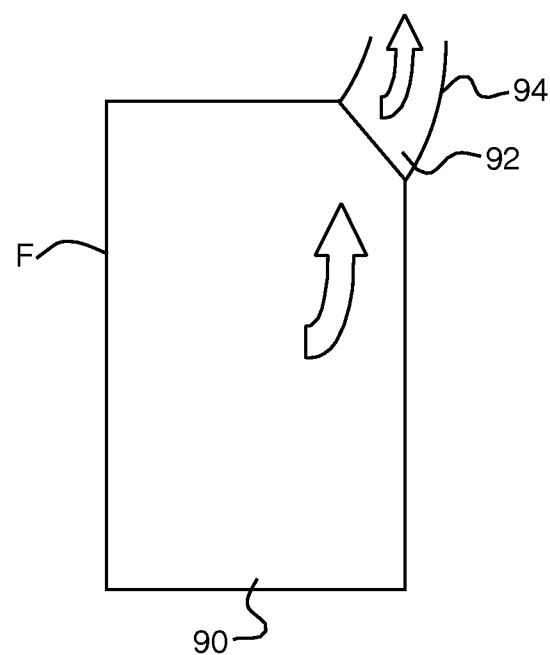
FIGS. 1B and 1C are similar drawings of two alternative embodiments of the invention.
Figure 1C:
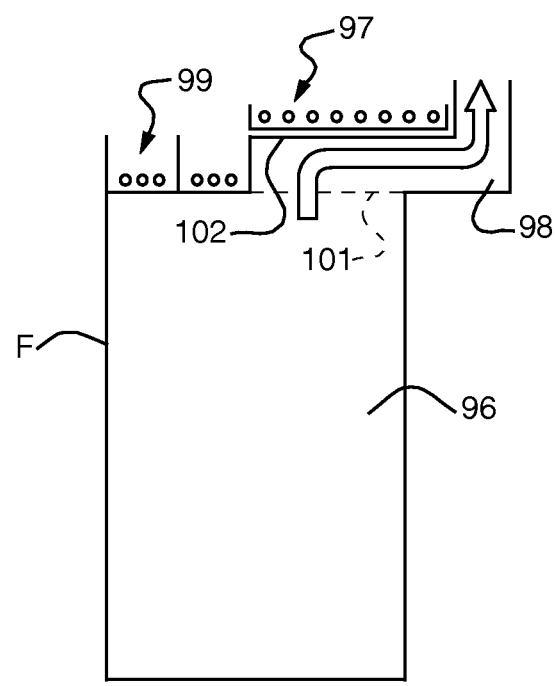

FIGS. 1A-1C schematically depict three concepts for accomplishing the invention, which is an assembly for extracting heat from a housing for electronic equipment. In this case, housing 10 may be a computer server rack such as a "Paramount" enclosure offered by Wright Line LLC of Worcester, Mass. Computer equipment rack 10 holds a number of modules or the like each comprising computer equipment: a series of vertically-arranged computer server modules 12, 14 . . . 20 are shown. Rack 10 is a rectangular prism with front 30, top 32, and back 34. The two solid sides are not shown in the drawing. In accordance with the invention, back 34 is essentially solid except for open area 36 comprising opening or perforated area 11 in back 34 proximate top 32 and opening or perforated area 13 in top 32 proximate back 34. The open area 36 comprises some of the back, and may include an adjacent portion of the top as shown in this drawing. Air passageway 40 is in fluid communication with open area 36, to conduct heated air exiting housing 10 through open area 36 away from housing 10 and into enclosed air return ceiling area 50. Cool air enters housing 10 through perforated front door 30.

FIGS. 1B and 1C are two additional conceptual embodiments of the invention. Embodiment 90, FIG. 1B, has open area 92 at the top/back corner, with air passageway 94 communicating therewith. Air enters through front F. Embodiment 96, FIG. 1C, has open area 101 in the top, with air passageway 98 communicating therewith. Air enters through front F. In this case, even though the heated air outlet is in the top (and could also be in some of the adjacent back, a feature not shown in this drawing), the top is still available to carry cables and/or other equipment by including raised top portion 102, which forms part of passageway 98. Top portion 102 can actually be the top of a rigid version of passageway 98, which may be accomplished with a duct. Cable trays 97 and 99 route cables or other equipment along the top.

Figure 2:
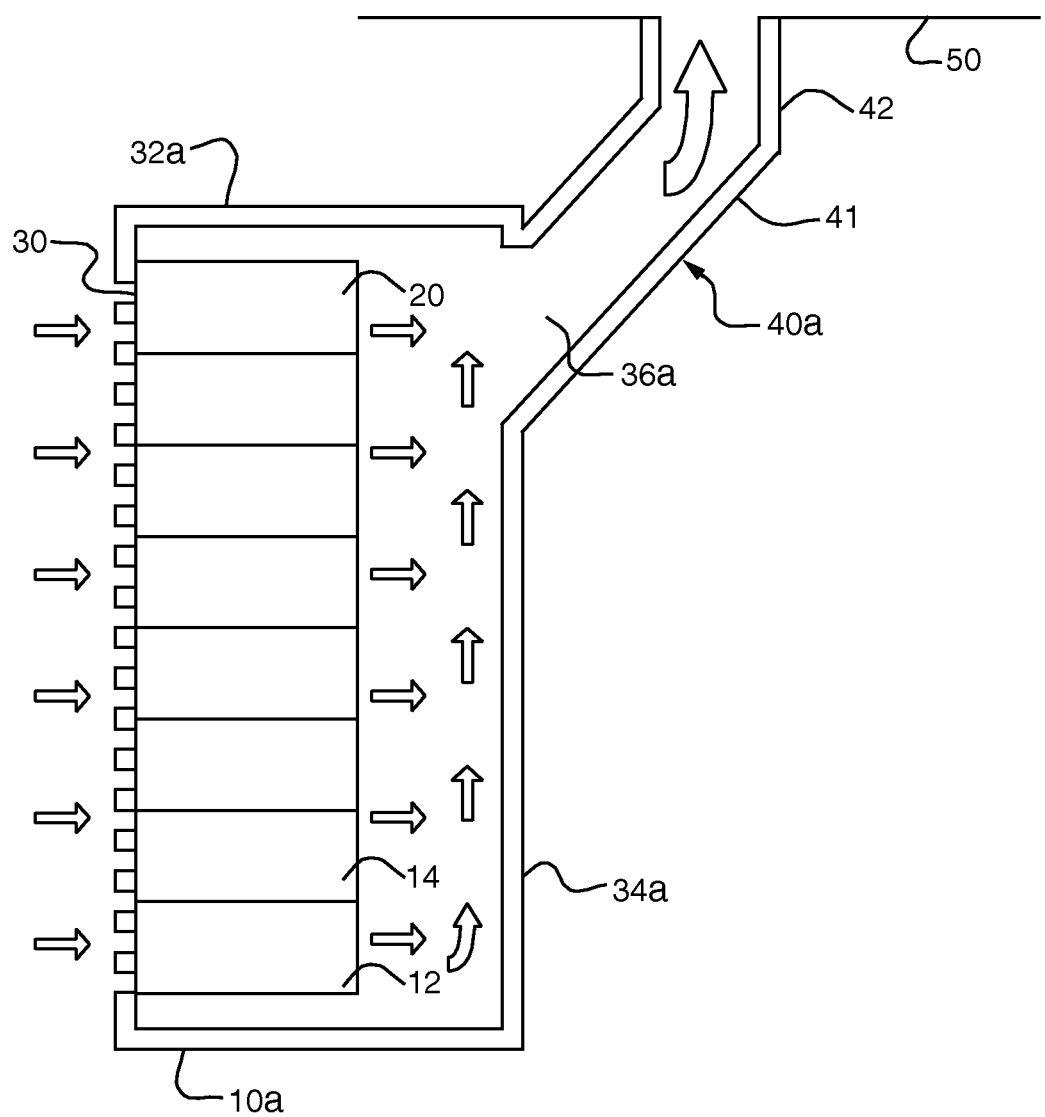
FIG. 2 is a schematic, cross-sectional view of another embodiment of the invention accomplished in a computer equipment rack with an assembly for extracting heat from the rack in accordance with the present invention.

One preferred embodiment of an assembly for extracting heat from a housing for electronic equipment is shown in FIG. 2. Computer equipment rack 10a holds a number of modules or the like each comprising computer equipment: a series of vertically-arranged modules 12, 14 . . . 20 are shown. Rack 10a is typically a rectangular prism shape, and has a perforated front 30, top 32a, and back 34a; the solid side panels are not shown. In accordance with the invention, back 34a is essentially solid except for open area 36a proximate top 32a. Air passageway 40a is in fluid communication with open area 36a, to conduct heated air exiting housing 10a through open area 36a away from housing 10a. Air passageway 40a in this example comprises first section 41 that is angled at about 45 degrees up and away from the plane of back 34a, and more vertical section 42 that leads to enclosed air return ceiling area 50. Cool air enters housing 10a through perforated front door 30.

The invention contemplates any reasonable arrangement of an air passageway that is in fluid communication with an open area at the top of the back and/or the back of the top. The open area preferably extends across at least a majority of the width of the back of the housing, and may also encompass a portion of the top of the housing adjacent to the back, as shown in FIGS. 1A and 1B. In the preferred embodiment, a significant portion of the top is essentially solid so that the majority (or all) of the top area of the housing is available for routing cables and holding other peripheral equipment that is necessary in a data center, as shown in FIG. 1C. This contrasts the invention with racks that have one or more openings in the top that directly vent heated air into the room or a vertical duct but that take away area from the top of the racks that could otherwise be used for routing other data center equipment, such as power and data cables and the like.

The open area can be any shape or arrangement. The assembly of this invention can be installed in a new equipment rack or offered as an after-market product with a back having a particular size, shape and location of an open area, and an air passageway that may be accomplished with one or more flexible or inflexible ducts or conduits, depending upon the particular arrangement.

Once such particular arrangement is shown in FIG. 3, which illustrates two adjacent identical racks 10b, one in cross section and one in a rear view. Air passageway 60 comprises two side-by-side essentially identical circular flexible ducts 61 and 63 that are coupled to the upper back area of each of equipment rack 10a (viewed from the side) and rack 10b (viewed from the back, in which split rear door 70, located below ducts 61 and 63, is visible). This drawing also illustrates one option in which an air-moving device 62 is placed in air passageway 60, or in fluid communication therewith, to assist the movement of air.

Overall airflow is depicted in the drawings by the solid arrows. Preferably, the solid front door of the rack is replaced with a perforated front that has a series of openings, somewhat like a screen door. This allows cooled room air to enter the front of the rack and pass through equipment modules 12, 14 . . . 20. Heated air flows out through the back of these modules, typically assisted by fans located in the modules themselves. The heated air is naturally buoyant and rises along back 34c and out through open area 36c. The inventive assembly thus acts somewhat like a chimney in that it is a passageway to allow heated air to escape from the inside of a housing for electronic equipment.

FIG. 3 also illustrates an embodiment of a data center arrangement according to this invention comprising two or more electronic equipment racks 10a and 10b. In this embodiment, racks 10a and 10b are essentially equivalent to rack 10, FIG. 1, except for the particular arrangement of the open area in backs 34c near the tops of the racks. Air passageways 60 connect these openings to enclosed ceiling area 50 which leads to air conditioning unit 52 that cools the air and blows it back into the data center so that it can enter the perforated front of racks 10a and 10b. Air-moving devices 62 may not be necessary if there is sufficient pressure drop in ceiling area 50 to draw the heated air up into area 50; this is a detail that depends on the particular arrangement of the data center.

The invention accomplishes efficient cooling of electronic equipment in the housing without the need for deep rear doors having internal fans and ducting that withdraws heated air out of the housing and blows it out of the top of the door, of the type known in the art. The invention thus accomplishes efficient cooling without increasing the depth of the equipment rack up to the height B off of the floor at which the air passageway projects from the housing. This allows racks to be separated by a minimum width A. Dimensions A and B may be dictated by local, state and/or federal regulations, such as the Americans with Disability Act (ADA) and/or the National Fire Protection Association (NFPA) codes. In one example, regulations require an 80" unobstructed headroom height (which can establish the minimum height "B"), and a minimum aisle width of 36" (which can establish the minimum inter-rack spacing "A"). Regardless of the minimum dimensional needs, the invention accomplishes a maximum density of equipment housings in a data center area, as it does away with the need for thickened front and/or rear doors that have been necessary to accommodate air-handling equipment.

Alternative embodiments of an assembly for extracting heat from a housing are shown in FIGS. 4A through 8. Some variations of different aspects of this embodiment are shown in the various figures, as will be described. These embodiments are especially designed to be used as an after-market product, as a replacement for the rear panel or rear door(s) of an electronics rack. In some cases the assembly also replaces the top panel of a rack. One aspect of this embodiment comprises chimney 200, FIG. 4A. Chimney 200 includes a first section 210 that is adapted to be coupled to the housing such that the chimney encompasses the top rear corner of the housing, and thus is in fluid communication with any opening(s) at the back of the top of the housing and any opening(s) at the top of the back of the housing. The chimney thus conducts heated air leaving the housing (by convection or under fan assist) through such openings. The chimney is like a duct and is largely open, to allow it to conduct heated air exiting the housing through these openings to leave the chimney, as described above. An alternative to a passive chimney is an active chimney with one or more fans, as will be described.

First section 210 at its lower end forms a coupling portion 203 that is generally L-shaped as defined by horizontal and vertical members, so that it closely conforms to the top back corner of the rectangular prism-shaped housing, which for example may be a server rack as described above. Thus, chimney 210 fits tightly over and follows the contour of the top back corner of the housing. This allows hot air exiting the housing through its top back corner to move up into the chimney rather than leaking into the room. In this embodiment, sidewalls 212 and 213 also define this "L-shape." Rear wall 211 is angled upward and outward with respect to the back of the enclosure (i.e., with respect to the vertical) at an angle of less than 90 degrees, preferably about 45 degrees.

Second section 220 generally has the shape of a rectangular duct. This embodiment of the chimney is active, carrying one or more fan trays 230 within second section 220. Access to the fan trays is provided through hinged door 221. Panel 222 is a fixed panel. Section 220 is completed by sides 223 and 224, and front wall 225. Section 220 defines chimney exit 226 that is typically coupled to another structure such as a suspended ceiling or another duct that leads to an air conditioning unit that cools the air and returns it either to the room or directly to the housings/enclosures, as is known in the art. The angled and rectangular shapes are not limitations, as other shapes and arrangements are possible depending on the enclosure and the room layout.

Figure 4A:
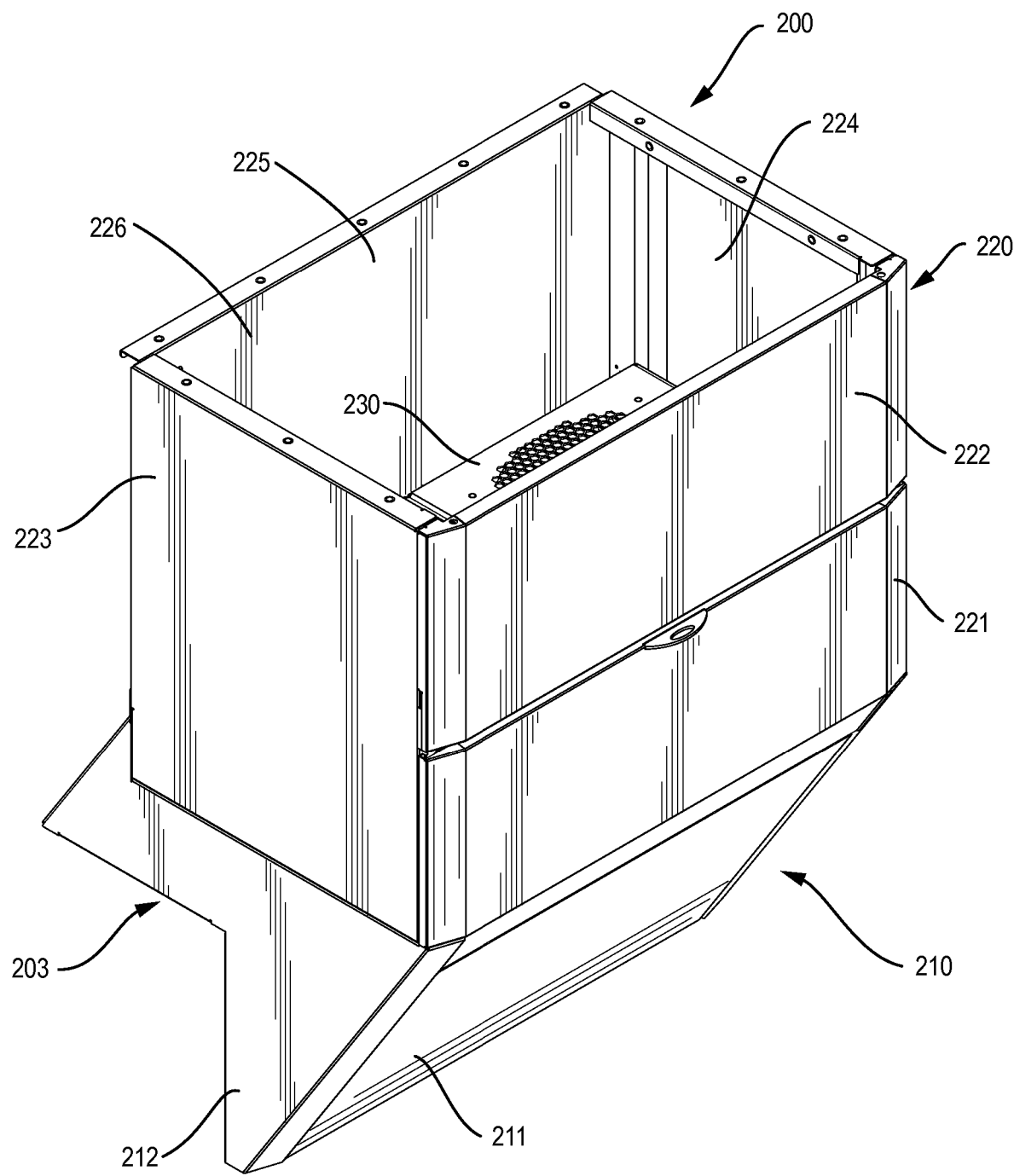
FIG. 4A is a perspective view of an embodiment of a chimney for the inventive assembly.
Figure 4B:
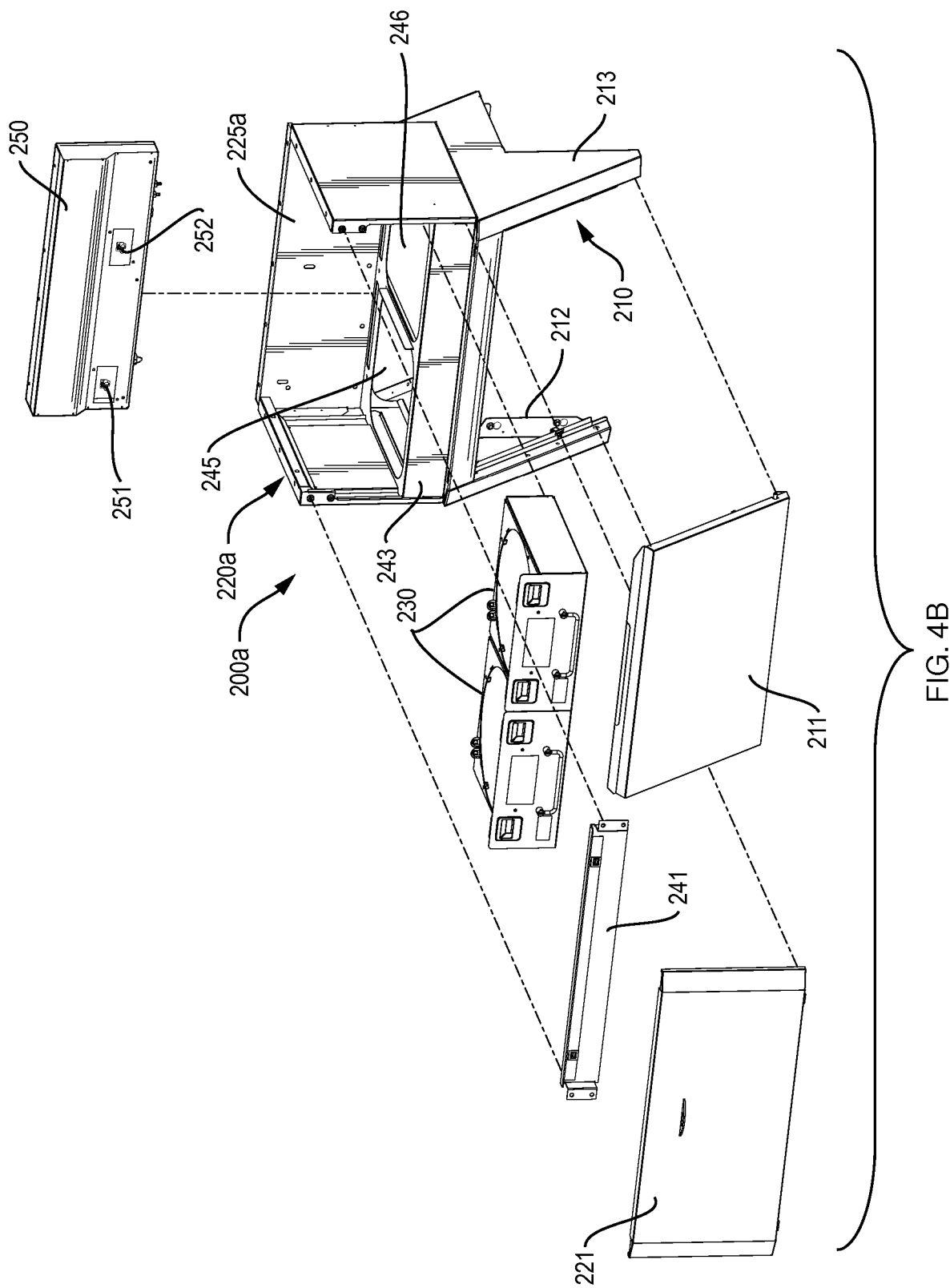
FIG. 4B is an exploded view of a chimney that is essentially the same as that shown in FIG. 4A.

More details of the construction of slightly different chimney 200a are shown in FIG. 4B. Generally square openings 245 and 246 are defined in member 243. In a passive structure, openings 245 and 246 can remain as shown, or member 243 can be removed so that sections 210 and 220 are wide open. If one fan was used, only one (larger) opening 245 or 246 would be present. In this active embodiment, two fan trays 230 slidingly engage with the assembly just above openings 245 and 246. Panel 241 is coupled to the front of member 243 to provide a hinged anchor point for door 221 that pivots on a horizontal axis about hinges (not shown) carried by member 241. Electrical supply adaptor 250 is coupled to the inside of front wall 225a and defines electrical supply connectors 251 and 252 that accept mating push-in electrical connectors in the backs of fan trays 230 so that the fans are supplied with power when they are pushed into the chimney and mate with these electrical supply connectors. This accomplishes a hot-swappable feature in which one or both fans can be removed and replaced while the device remains in operation, allowing a fan to be replaced without having to affect the operation of the servers or other electronic devices within the enclosure.

Figure 5A:
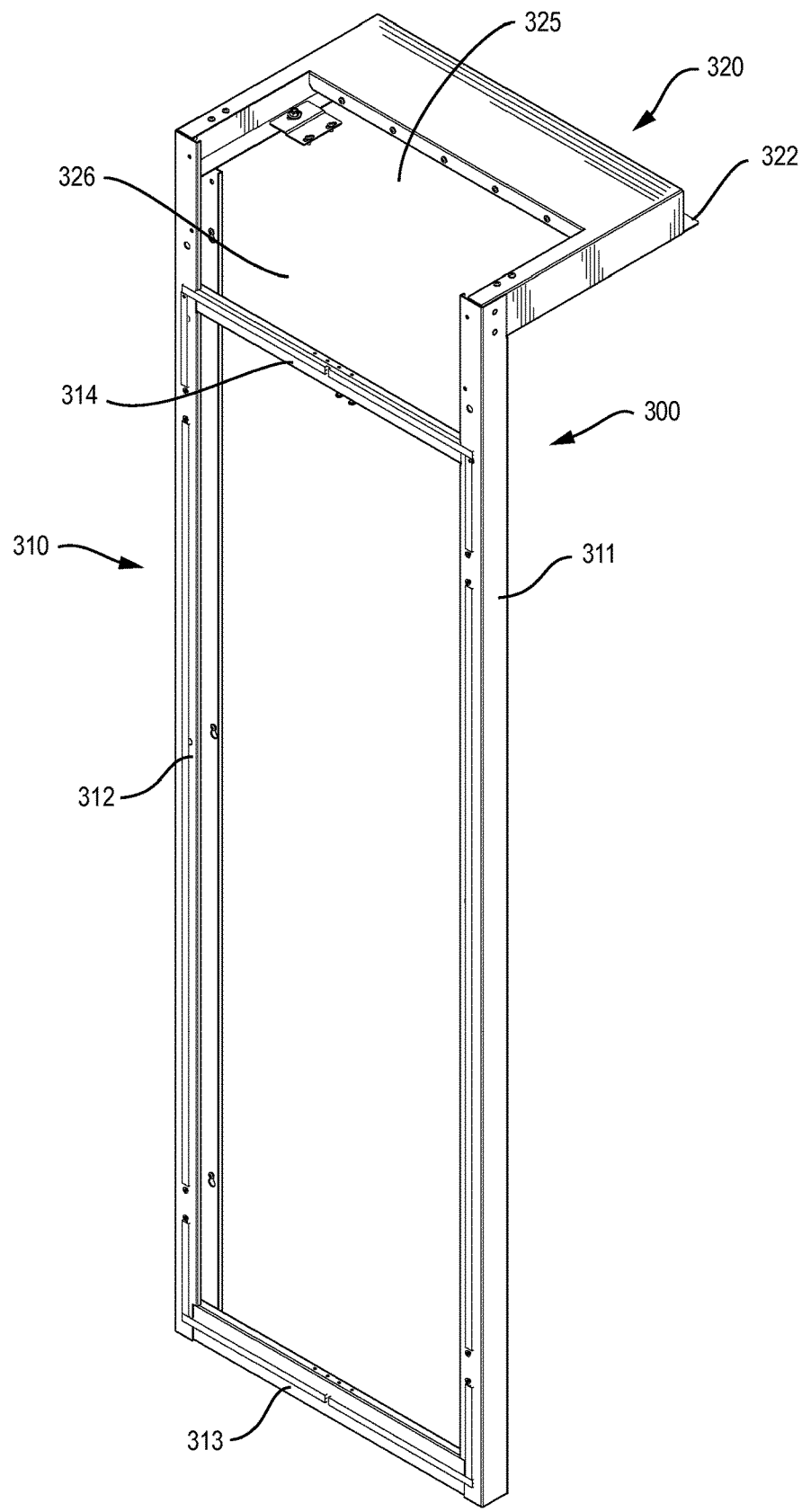
FIG. 5A is a perspective view of an intermediate assembly for an embodiment of the inventive assembly.
Figure 5B:
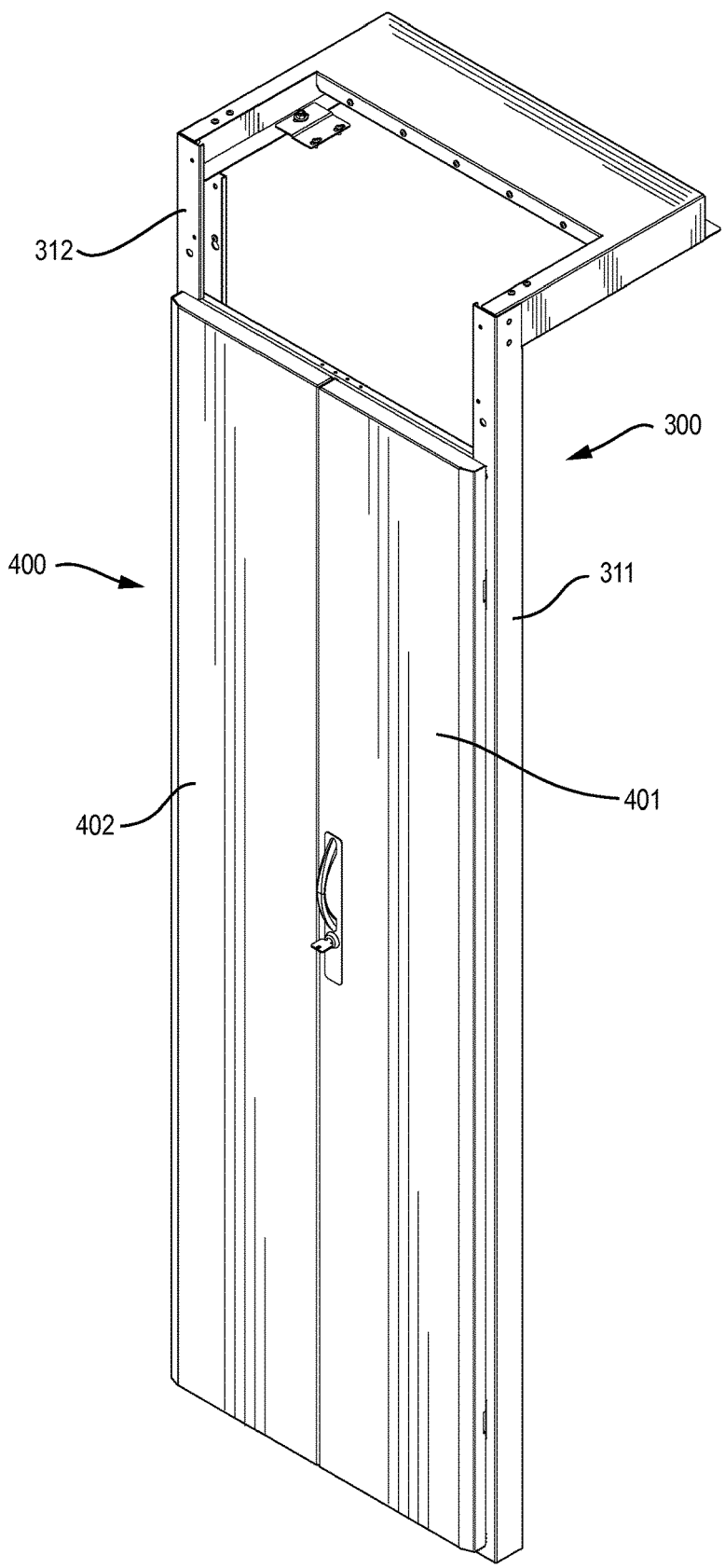
FIG. 5B shows the intermediate assembly of FIG. 5A with doors that allow access to the interior of the enclosure.

An embodiment of inventive assembly 600 further comprises intermediate assembly 300, FIGS. 5A and 5B. Intermediate assembly 300 comprises intermediate assembly vertical frame member 310, and intermediate assembly horizontal top portion 320. Assembly 600 (and indeed the entirety of the inventive assembly) is preferably fashioned of steel structural members and sheet metal panels, with appropriate fasteners. Frame 310 comprises right and left side vertical structural members 311 and 312 and top and bottom horizontal structural members 314 and 313, respectively. Member 314 defines the bottom extent of second opening 326 that spans essentially the entire width of the rear of the housing, where the rear and top meet. Top portion 320 defines the front edge of first opening 325 at the rear of the top of the enclosure where the top and rear meet, and also spans essentially the entire width of the enclosure. Openings 325 and 326 are preferably (but not necessarily) contiguous, in that they are either continuous or are immediately or closely adjacent. For example, if desirable, one or more additional cross members may be located in either of openings 325 or 326 or at their intersection without affecting the functionality of the invention, or the openings may be in different locations, or have different sizes and/or shapes. Openings 325 and 326 form the entry into chimney 200. When assembly 600 is in place, heated air leaving the enclosure from the back of the top and the top of the back will be conducted into chimney 200. The openings at the top of the back and the back of the top need not be contiguous, nor must both be present, as long as the chimney encompasses at least one of these, and preferably as much open area as possible to facilitate heat transfer out of the enclosure. Also, the openings can be either fully or partially open. For example, the openings could be partially closed by a screen or a perforated panel while still allowing heated air to escape the housing and enter the chimney.

In this embodiment, the back portion of the inventive assembly also comprises one or more doors to provide access to the housing interior through the back, although doors are not necessary and the back could be essentially closed, for example by a solid panel rather than doors. FIG. 5B shows a matched pair of doors 401 and 402 making up door assembly 400. These doors are mounted to members 311 and 312 along vertical hinges (not shown). Intermediate assembly 300, FIG. 5B, thus comprises essentially the entirety of the back portion of the housing or electronics enclosure, and in this case overlies some of its top portion. Embodiment 300 is typically used as a replacement for the back of an existing enclosure, and sits on top of the top panel of the housing. Alternative embodiment 300a, FIG. 8, includes top panel 341 that is coupled to flange 322 so that member 320 and member 341 comprise essentially the entirety of the top portion of the housing. Thus; embodiment 300a will typically replace both the top and back portions of an existing housing. Embodiment 300a shows optional openings 342 and 343 that can accept brushes or other permeable structures that allow cabling to be run through the top while maintaining the top essentially solid except for opening 325, so that heated air exits the top of the enclosure through opening 325 and is thus conveyed by the chimney, rather than escaping into the room housing the enclosure.

Figure 6:
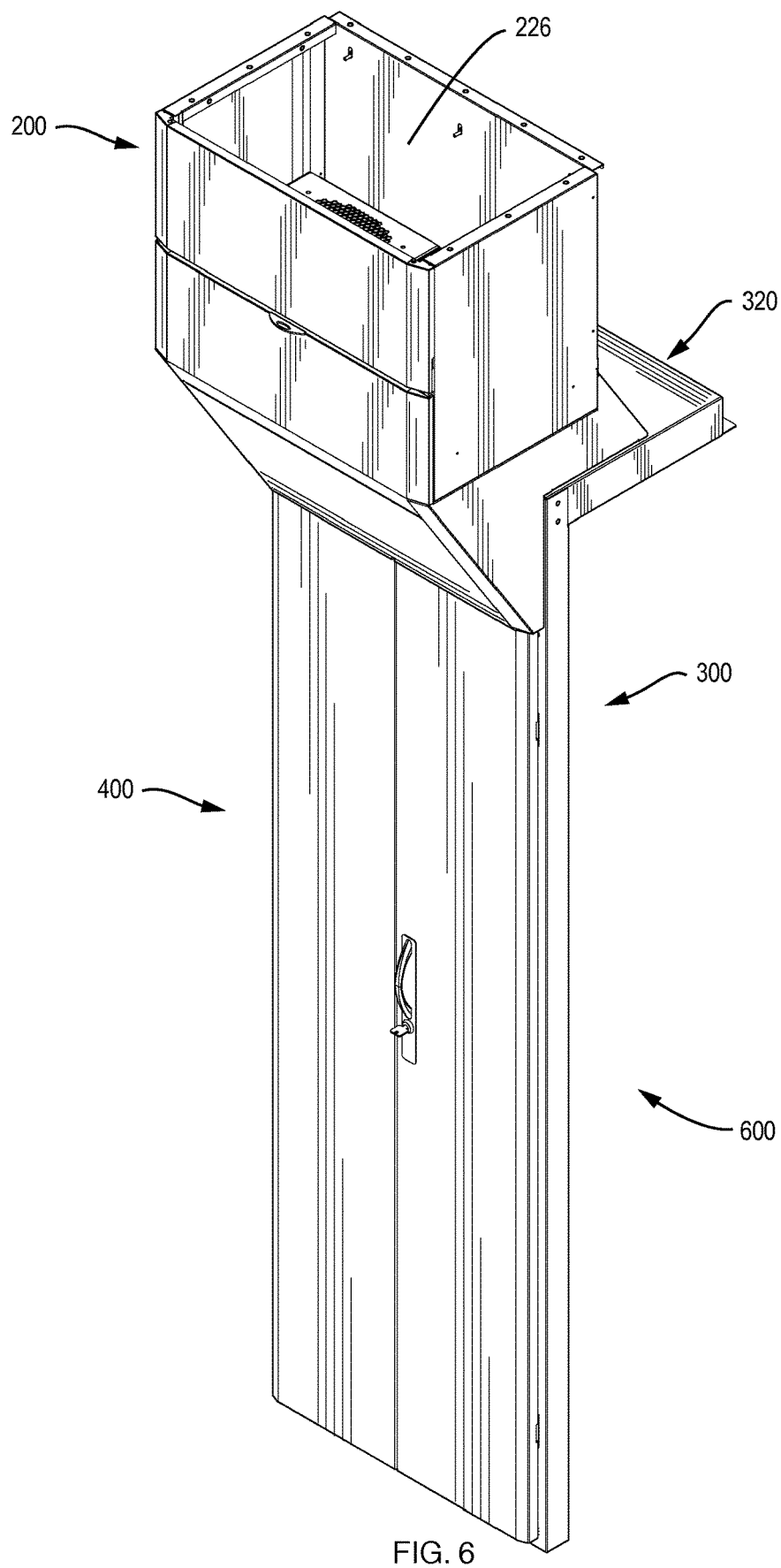
FIG. 6 shows the chimney of FIG. 4A coupled to the intermediate assembly of FIG. 5B.
Figure 8:
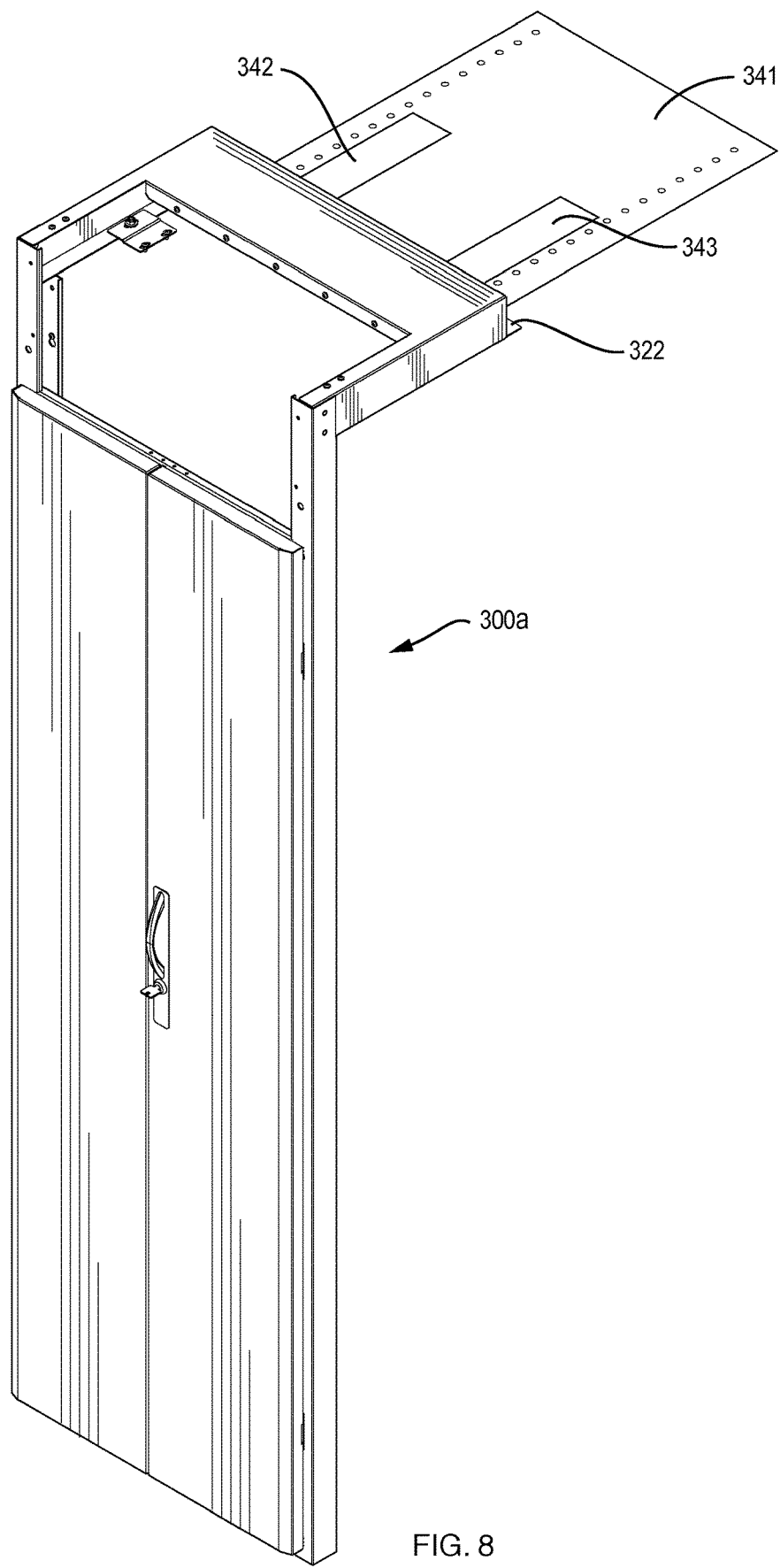
FIG. 8 is a view similar to that of FIG. 5A, but for an alternative intermediate assembly that further comprises a top panel for the enclosure.

FIG. 6 shows chimney 200 coupled to intermediate assembly 300, along with doors 400, together making up embodiment 600 of the inventive assembly for extracting heat from a housing. Embodiment 600 can be sized and shaped to replace the back of an existing housing for electronic equipment. This allows the functionality of the chimney to be added to an existing housing. Embodiment 600 can thus accomplish additional cooling air flow in a housing, thus allowing existing housings to carry more heat-generating electronic devices.

FIGS. 7A and 7B show more detail of the construction of one housing with which this embodiment of the invention can be used, such as the "Paramount" enclosure detailed above. Cabinet frame 520 carries essentially solid side panels 502 and 503 and defines right and left side rear vertical support surfaces 506 and 507 to which intermediate assembly frame member 310 is attached. Rear cross member 313 sits on and is attached to lower ledge 501.

FIG. 7B is an exploded view of the inventive assembly used with a housing having an existing top panel 511 that defines relatively small openings 512-515. The back door(s) or back panel (not shown) is removed. The inventive assembly is then fastened to the cabinet, and essentially replaces the back doors and sits over (rather than replacing) enclosure top panel 511. Frame 310 is fastened to members 506, 507 and 501. Members 321 and 322 make up portion 320. "U"-shaped frame member 321 is fastened to the upper ends of frame 310. Partial cover member 322 sits on top of member 321; optional cutouts 322*a* and 322*b* are shown to accommodate wiring passing through the top of the cabinet. Rear flange 323 is coupled to front flange 324 of chimney 200. This creates assembly 600. Air is drawn out of enclosure 500 through opening 326 created between member 314 and top 511, and also through any of openings 512-515 that are encompassed by chimney 200.

It should be understood that the embodiments described herein are exemplary and do not limit the scope of the invention, and that various modifications could be made by those skilled in the art that would fall under the scope of the invention. The scope of the invention is set forth in the claims.

What is claimed is:

1. An assembly for extracting heat, the assembly comprising:
    a housing with an interior that is adapted to hold heat-generating electronic equipment, the housing defined by a housing top, a housing front, a housing back, and two housing sides,
        wherein the housing includes a continuous opening cut out of the housing back and the housing top, which leads from an exterior of the housing to the housing interior;
        and
    a chimney coupled to an exterior of the housing such that the chimney encompasses and is in fluid communication with the continuous opening, the chimney having an inlet for receiving air leaving the housing through the continuous opening and an outlet for directing the air out of the chimney.
2. The assembly of claim 1, wherein the housing back is essentially vertical and the housing top is essentially horizontal, such that the housing top and the housing back are essentially perpendicular, and wherein the chimney includes a coupling portion having first and second substantially perpendicular members, the coupling portion adapted to fit tightly over the housing such that the first substantially perpendicular member of the coupling portion extends along the housing top and the second substantially perpendicular member extends along the housing back.
3. The assembly of claim 2, wherein the continuous opening extends across at least a majority of the width of the housing back.
4. The assembly of claim 3, wherein the continuous opening extends across at least a majority of the width of the housing top.
5. The assembly of claim 1, wherein the assembly further includes a support assembly having a plurality of frame members, wherein the assembly further includes an intermediate assembly adapted to be coupled to the support assembly, and wherein the chimney is adapted to be coupled to the intermediate assembly.
6. The assembly of claim 5, wherein:
    the intermediate assembly comprises an intermediate assembly frame member adapted to extend along the housing back; and
    the intermediate assembly further comprises a door assembly hingedly coupled to the intermediate assembly frame member, to allow user access to the interior of the housing.
7. The assembly of claim 6, wherein the door assembly comprises two doors, one hingedly coupled to each side of the intermediate assembly frame member.
8. The assembly of claim 6, wherein the door assembly and the intermediate assembly frame member together form the housing back.
9. The assembly of claim 5, wherein:
    the chimney comprises a first section that is adapted to be coupled to the intermediate assembly, the first section adapted to extend outwards from the housing back at an angle of less than 90 degrees when assembled; and
    the housing back is essentially vertical and the housing top is essentially horizontal such that the housing top and the housing back are essentially perpendicular, and wherein the first section of the chimney comprises a coupling portion having substantially perpendicular members such that when the chimney is coupled to the housing, the coupling portion fits tightly over a portion of the housing top and a portion of the housing back.
10. The assembly of claim 9, wherein the chimney further comprises a second section that is adapted to extend substantially vertically from the first section.
11. The assembly of claim 10, wherein the second section of the chimney is a substantially rectangular duct.
12. The assembly of claim 10 further comprising one or more fan trays located within the chimney.
13. The assembly of claim 12, wherein the fan trays are hot-swappable.
14. The assembly of claim 12, wherein the second section of the chimney includes a hinged access door to allow access to the fan trays.
15. The assembly of claim 1, wherein the housing top and the housing back meet, and wherein the chimney includes a coupling portion, such that when the chimney is coupled to the housing the coupling portion fits tightly over and follows the contours of the housing top and housing back.
16. An assembly for extracting air comprising:
    a housing configured to house electronic equipment,
        wherein the housing includes a housing top, a housing back, a housing front, and two housing sides,
        wherein the housing top includes a continuous opening cut out of the housing top and the housing back, which leads from an exterior of the housing to an interior of the housing,
        wherein the continuous opening is configured to allow airflows exiting the continuous opening to cross each other;
    a chimney coupled to the housing such that the chimney encompasses and is in fluid communication with the continuous opening, and
        wherein the chimney includes an inlet for receiving air from an interior of the housing, and an outlet for expelling the air received from the interior of the housing.
17. The assembly for extracting air of claim 16, wherein the chimney includes an exhaust section that is adapted to extend outwards from the back of the housing at an angle less than 90 degrees when assembled, and wherein the chimney includes a substantially L-shaped section adapted to fit over the continuous opening of the housing.

\* \* \* \* \*